(12) United States Patent
Jeong et al.

(10) Patent No.: US 11,190,875 B2
(45) Date of Patent: Nov. 30, 2021

(54) ADJUSTMENT OF DYNAMIC RANGE AND TONE MAPPING IN AUDIO SYSTEM

(71) Applicant: SAMSUNG ELECTRONICS CO., LTD., Suwon-si (KR)

(72) Inventors: Hyeon Sik Jeong, Suwon-si (KR); Byeong Seob Ko, Suwon-si (KR); Sang Mo Son, Suwon-si (KR); Anant Baijal, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/765,037

(22) PCT Filed: Nov. 16, 2018

(86) PCT No.: PCT/KR2018/014149
§ 371 (c)(1),
(2) Date: May 18, 2020

(87) PCT Pub. No.: WO2019/098779
PCT Pub. Date: May 23, 2019

(65) Prior Publication Data
US 2020/0404419 A1    Dec. 24, 2020

(30) Foreign Application Priority Data
Nov. 17, 2017    (KR) .......................... 10-2017-0153492

(51) Int. Cl.
*H04R 3/04*    (2006.01)
*H04R 5/04*    (2006.01)
(52) U.S. Cl.
CPC ................ *H04R 3/04* (2013.01); *H04R 5/04* (2013.01); *H04R 2430/01* (2013.01)
(58) Field of Classification Search
None
See application file for complete search history.

(56) References Cited

U.S. PATENT DOCUMENTS

| | | |
|---|---|---|
| 2008/0269926 A1 | 10/2008 | Xiang et al. |
| 2009/0097676 A1 | 4/2009 | Seefeldt |
| 2013/0163784 A1 | 6/2013 | Tracey et al. |

FOREIGN PATENT DOCUMENTS

| | | |
|---|---|---|
| JP | 2013-98832 A | 5/2013 |
| KR | 10-1400865 B1 | 5/2014 |

(Continued)

OTHER PUBLICATIONS

International Search Report (PCT/ISA/21) dated Mar. 20, 2019 by the International Searching Authority in counterpart International Patent Application No. PCT/KR2018/014149.

(Continued)

*Primary Examiner* — James K Mooney
(74) *Attorney, Agent, or Firm* — Sughrue Mion, PLLC

(57) ABSTRACT

The present disclosure relates to an audio system and a method of controlling the same. An aspect of the present disclosure is to provide an optimal listening state according to a user setting volume and hardware characteristics of an audio system. The audio system includes a signal inputter configured to receive an input audio signal; a signal processor configure to variably apply a dynamic range for each area of the input audio signal, to apply a scaling of a size corresponding to an inverse number of a boosting gain determined by a user setting volume for the input audio signal, to perform a tone mapping of the input audio signal by applying the boosting gain, to perform signal compensation for the input audio signal by the inverse number of the scaling, and to apply a master volume according to the user setting volume; a storage configured to store parameters used in signal processing of the signal processor; and a signal outputter configured to output the audio signal processed by the signal processor.

20 Claims, 19 Drawing Sheets

(56) References Cited

FOREIGN PATENT DOCUMENTS

KR  10-2014-0067064 A  6/2014
KR  10-1405847 B1  6/2014

OTHER PUBLICATIONS

Written Opinion (PCT/ISA/237) dated Mar. 20, 2019 by the International Searching Authority in counterpart International Patent Application No. PCT/KR2018/014149.
Communication dated Oct. 1, 2020 issued by the European Patent Office in European Application No. 18879218.8.

FIG. 6
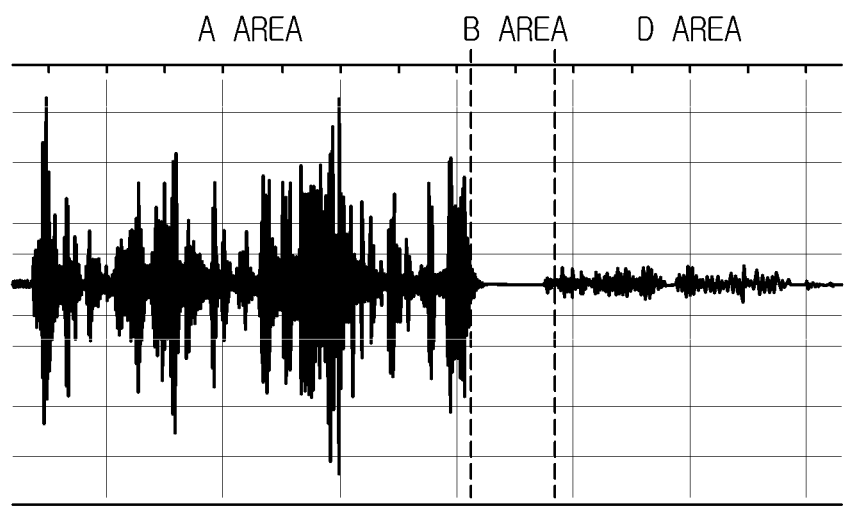
(I) BEFORE DR REMAPPING
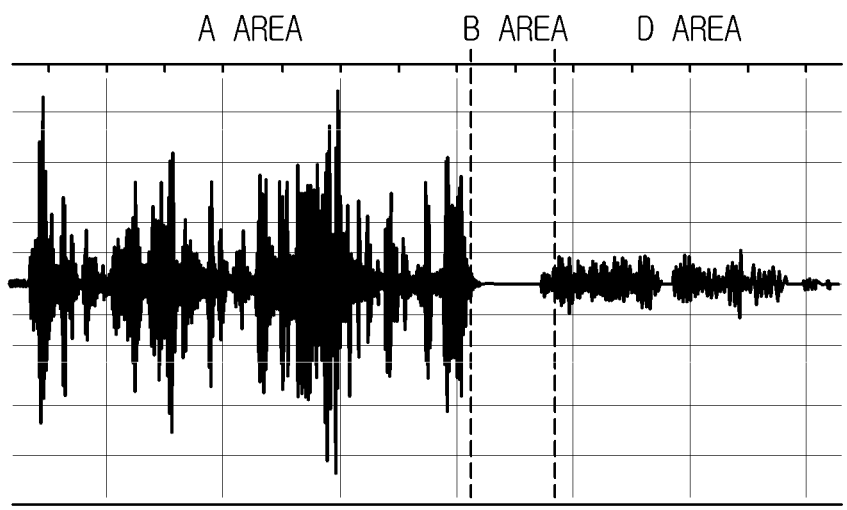
(II) AFTER DR REMAPPING

FIG. 13
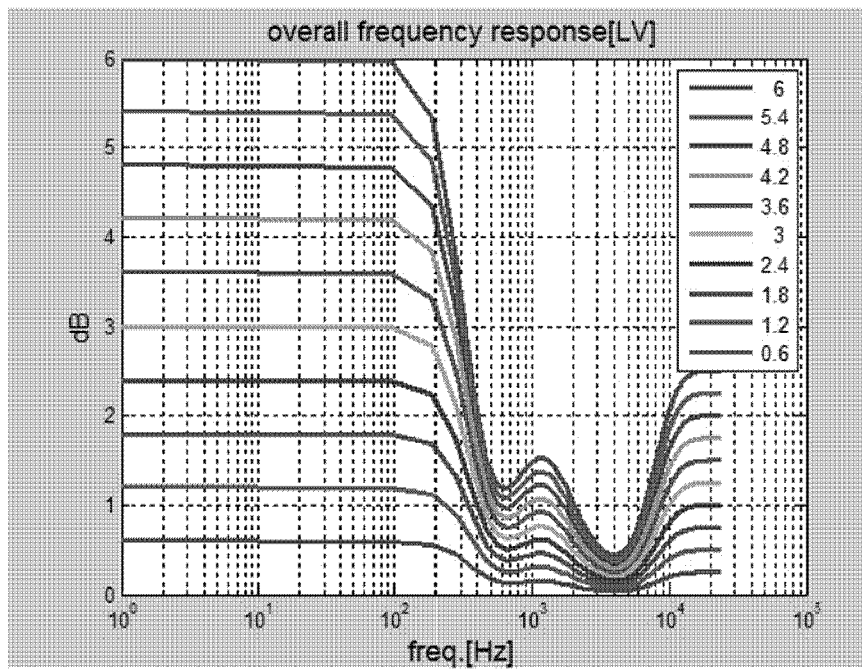
(Ⅰ)TONE MAPPING CURVE (LOW VOLUME)
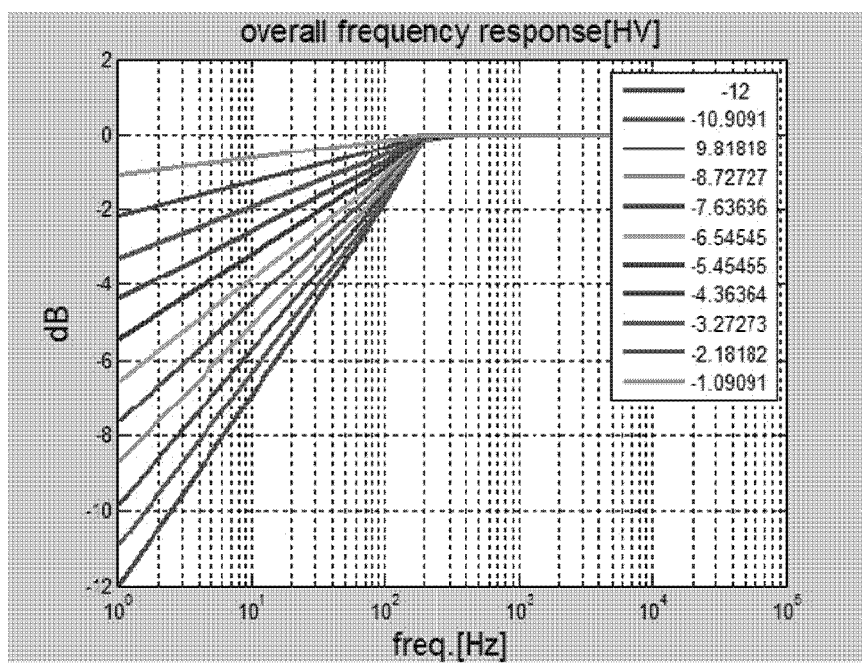
(Ⅱ)TONE MAPPING CURVE (HIGH VOLUME)

FIG. 14
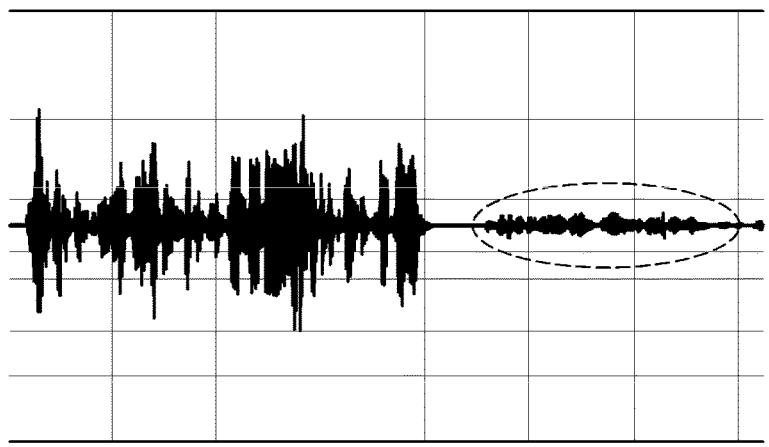
(I) INPUT AUDIO SIGNAL
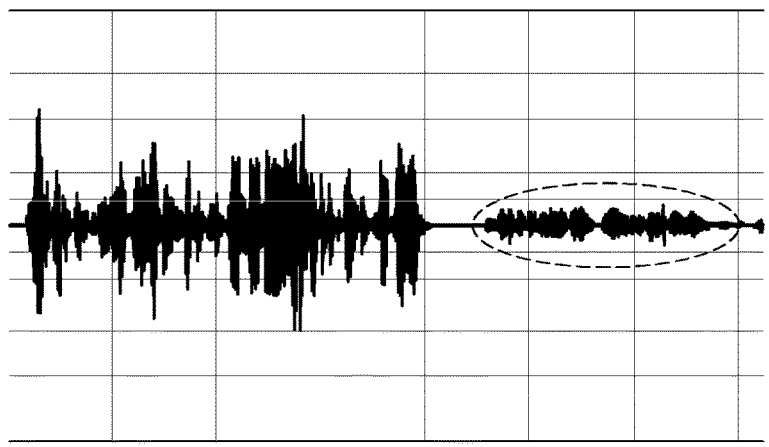
(II) DR REMAPPING
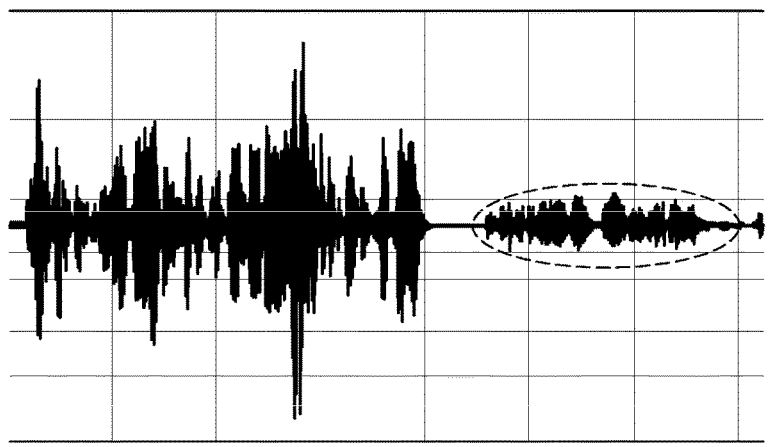
(III) : DR REMAPPING + TONE MAPPING

ADJUSTMENT OF DYNAMIC RANGE AND TONE MAPPING IN AUDIO SYSTEM

TECHNICAL FIELD

The present disclosure relates to an audio system.

BACKGROUND ART

In a digital audio signal processing system, a headroom is applied to an input digital audio signal in consideration of a scaling or a gain applied to a signal processing before performing a digital audio signal processing. After passing through a series of signal processing processes, the digital audio signal with the headroom is attenuated according to a user setting volume and then output to an amplifier and a speaker.

An output dynamic range of an audio system is limited by hardware-level limitations of the audio system, such as the user setting volume and physical characteristics of the speaker. In particular, an overall volume may decrease due to the user setting volume. Due to the limitation of the output dynamic range or the volume reduction, it is difficult for a user (listener) to properly appreciate an original rich bass, clear voice, and fine sounds of the audio signal. In addition, even if the user setting volume is high, the audio signal may be distorted due to the physical characteristics of the speaker.

DISCLOSURE

Technical Problem

An aspect of the present disclosure is to provide an optimal listening state according to a user setting volume and hardware characteristics of an audio system.

Technical Solution

An aspect of the present disclosure provides an audio system including: a signal inputter configured to receive an input audio signal; a signal processor configure to variably apply a dynamic range for each area of the input audio signal, to apply a scaling of a size corresponding to an inverse number of a boosting gain determined by a user setting volume for the input audio signal, to perform a tone mapping of the input audio signal by applying the boosting gain, to perform signal compensation for the input audio signal by the inverse number of the scaling, and to apply a master volume according to the user setting volume; a storage configured to store parameters used in signal processing of the signal processor; and a signal outputter configured to output the audio signal processed by the signal processor.

The signal processor may include a pre-signal processor configured to variably apply the dynamic range for each area of the input audio signal; a pre-scale processor configured to apply the scaling of the size corresponding to the inverse number of the boosting gain determined by the user setting volume for the input audio signal; a main-signal processor configured to perform the tone mapping of the input audio signal by applying the boosting gain; and a post-signal processor configured to perform the signal compensation for the input audio signal by the inverse number of the scaling.

The main-signal processor may be configured to perform the tone mapping by reflecting human hearing characteristics and output characteristics of the audio system according to the user setting volume.

The main-signal processor may be configured to apply the tone mapping of different curves for each volume step of an entire volume section.

The main-signal processor may be configured to divide an entire volume section into a plurality of unit volume sections, and to apply the tone mapping of different curves to each of the plurality of unit sections.

The main-signal processor may be configured to divide an entire volume section into a low volume section and a high volume section, and to apply the tone mapping of different curves to each of the low volume section and the high volume section.

The audio system may further include a master volume controller configured to apply the master volume according to the user setting volume.

The audio system may further include a headroom is applied to the input audio signal prior to the signal processing of the pre-signal processor.

The audio system may further include a headroom is applied to the input audio signal after the signal processing of the pre-signal processor.

Another aspect of the present disclosure provides a method of controlling an audio system including: a pre-signal processing step of variably applying a dynamic range for each area of an input audio signal; a pre-scale processing step of applying a scaling of a size corresponding to an inverse number of a boosting gain determined by a user setting volume for the input audio signal; a main-signal processing step of performing a tone mapping of the input audio signal by applying the boosting gain; and a post-signal processing step of performing signal compensation on the input audio signal by the inverse number of the scaling.

The main-signal processing step may be configured to perform the tone mapping by reflecting human hearing characteristics and output characteristics of the audio system according to the user setting volume.

The main-signal processing step may be configured to apply the tone mapping of different curves for each volume step of an entire volume section.

The main-signal processing step may be configured to divide an entire volume section into a plurality of unit volume sections, and to apply the tone mapping of different curves to each of the plurality of unit sections.

The main-signal processing step may be configured to divide an entire volume section into a low volume section and a high volume section, and to apply the tone mapping of different curves to each of the low volume section and the high volume section.

The method may further include a master volume control step of applying a master volume according to the user setting volume.

The method may further include applying a headroom to the input audio signal prior to signal processing in the pre-signal processing step.

The method may further include applying a headroom to the input audio signal after signal processing in the pre-signal processing step.

Another aspect of the present disclosure provides a method of controlling an audio system including: a pre-signal processing step of variably applying a dynamic range for each area of an input audio signal; a pre-scale processing step of applying a scaling of a size corresponding to an inverse number of a boosting gain determined by a user setting volume for the input audio signal; a main-signal processing step of performing a tone mapping of the input audio signal by applying the boosting gain; a master volume control step of applying a master volume according to the user setting volume; and a post-signal processing step of performing signal compensation on the input audio signal by the inverse number of the scaling.

The method may further include dividing an entire volume section into a low volume section, a high volume section, and a middle volume section; when the user setting volume belongs to the low volume section, performing the pre-signal processing step, the pre-scale processing step, the main-signal processing step, the master volume control step, and the post-signal processing step; when the user setting volume belongs to the high volume section, performing only the main-signal processing step, the master volume control step, and the post-signal processing step; and when the user setting volume belongs to the middle volume section, performing only the master volume control step and the post-signal processing step.

Another aspect of the present disclosure provides an audio system including: a pre-signal processing step of variably applying a dynamic range for each area of an input audio signal; a pre-signal processor configured to vary a volume of each area by variably applying a dynamic range for each area divided based on an input audio signal level; a pre-scale processor configured to calculate a boosting gain determined by a user setting volume and to apply a scaling of a size corresponding to an inverse number of the boosting gain to the input audio signal; a main-signal processor configured to perform a tone mapping of the input audio signal by applying the boosting gain determined by the user setting volume; and a post-signal processor configured to perform signal compensation for the input audio signal by the inverse number of the scaling applied by the pre-scale processor.

Advantageous Effects

According to an aspect of an embodiment, an optimal listening state may be provided according to a user setting volume and hardware characteristics of an audio system.

DESCRIPTION OF DRAWINGS

FIG. 6 is a view illustrating a change in an input audio signal by dynamic range remapping according to an embodiment.

FIG. 13 is a view illustrating an example of a tone mapping curve generated by a main-signal processor of an audio system according to an embodiment.

FIG. 14 is a view illustrating a signal in which dynamic range remapping and tone mapping are performed in an audio system according to an embodiment.

MODES OF THE INVENTION

Figure 1:
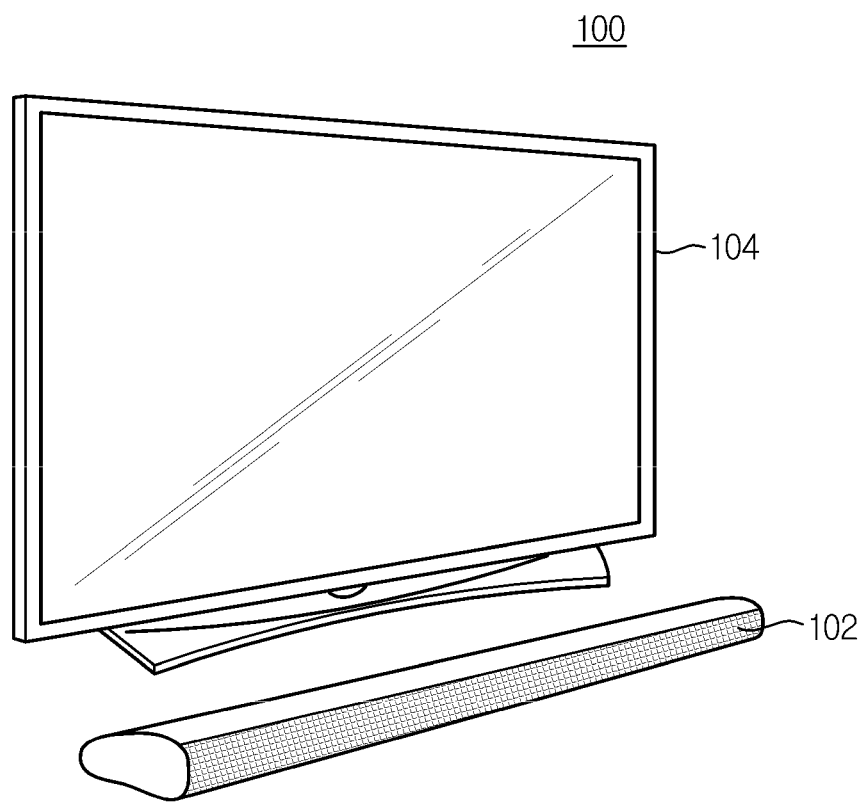
FIG. 1 is a view illustrating an example of an audio system according to an embodiment.

FIG. 1 is a view illustrating an example of an audio system according to an embodiment.

An example of an audio system 100 illustrated in FIG. 1 is a television 104. The television 104 is basically an image apparatus, but when viewing a video content through the television 104, not only an image quality but also an audio quality may be an important viewing point. Therefore, audio signal processing for outputting a high-quality audio from the television 104 may be said to be as important as video signal processing. A speaker 492 may be installed in the television 104. The audio system 100 according to the embodiment is not limited to the television 104 and may include a variety of devices requiring audio signal processing, such as a professional audio device for listening to music or a PC-FI using a laptop/desktop.

Figure 2:
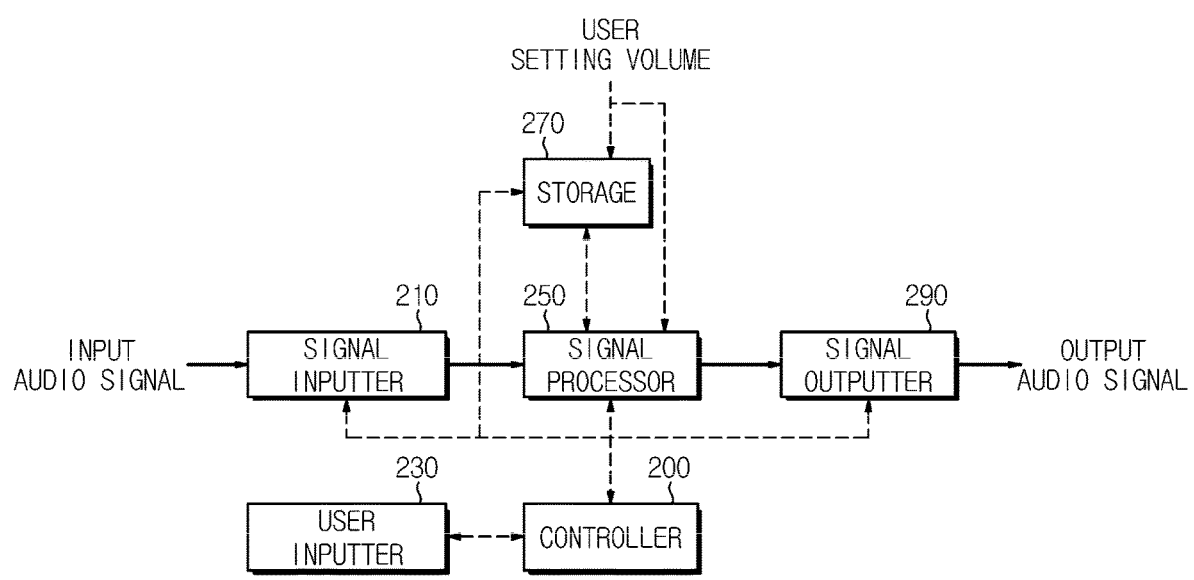
FIG. 2 is a view illustrating a configuration for signal processing in an audio system according to an embodiment.

FIG. 2 is a view illustrating a configuration for signal processing in an audio system according to an embodiment. In particular, FIG. 2 is a view illustrating a device configuration for audio signal processing.

As illustrated in FIG. 2, an input audio signal is finally output through a signal inputter 210, a signal processor 250, and a signal outputter 290. A storage 270 is connected to the signal processor 270. A controller 200 may be provided to participate in an overall control of the audio system 100. In particular, the controller 200 may control an entirety of a signal processing process until the input audio signal is finally output. A user inputter 230 may be connected to the controller 200. The user inputter 230 may be a user interface provided in the audio system 100. In particular, the user inputter 230 may include a volume control for the user to set a volume. The user setting volume set by the user through the user inputter 230 may be transmitted to the signal processor 250 and the storage 270 through the controller 200.

Figure 4:
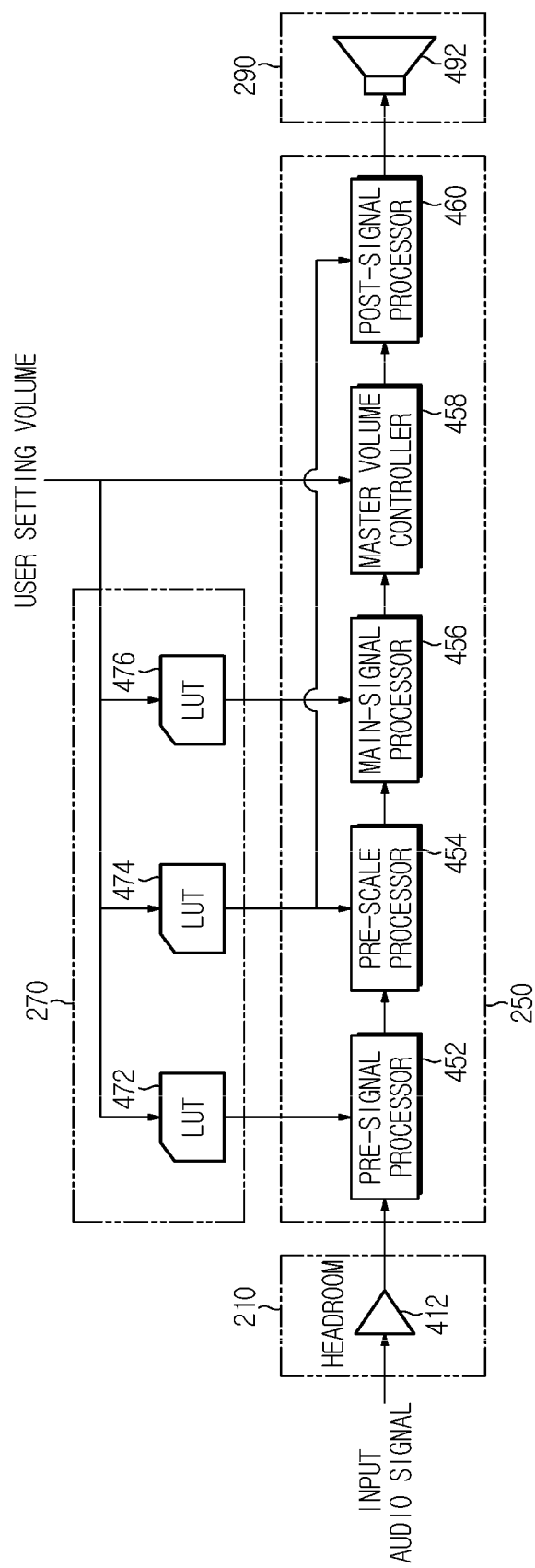
FIG. 4 is a view illustrating in detail a configuration of a signal processor of the audio system illustrated in FIG. 3.

The signal inputter 210 may include a headroom (see 412 in FIG. 4). In the embodiment, the headroom 412 may refer to a device for applying the headroom, but may also refer to the headroom itself applied to the audio signal. The headroom 412 may be applied to the input audio signal in consideration of a scaling or a gain used for signal processing of the input audio signal. The audio signal to which the headroom 412 is applied may be output through the speaker 492 after a series of signal processing processes. The headroom 412 may be provided at a front end of the audio signal processing to prevent problems such as overflow or clipping that may occur when processing the audio signal.

The signal outputter 290 may include a speaker (see 492 in FIG. 4). Also, the signal outputter 290 may further include an amplifier.

Figure 3:
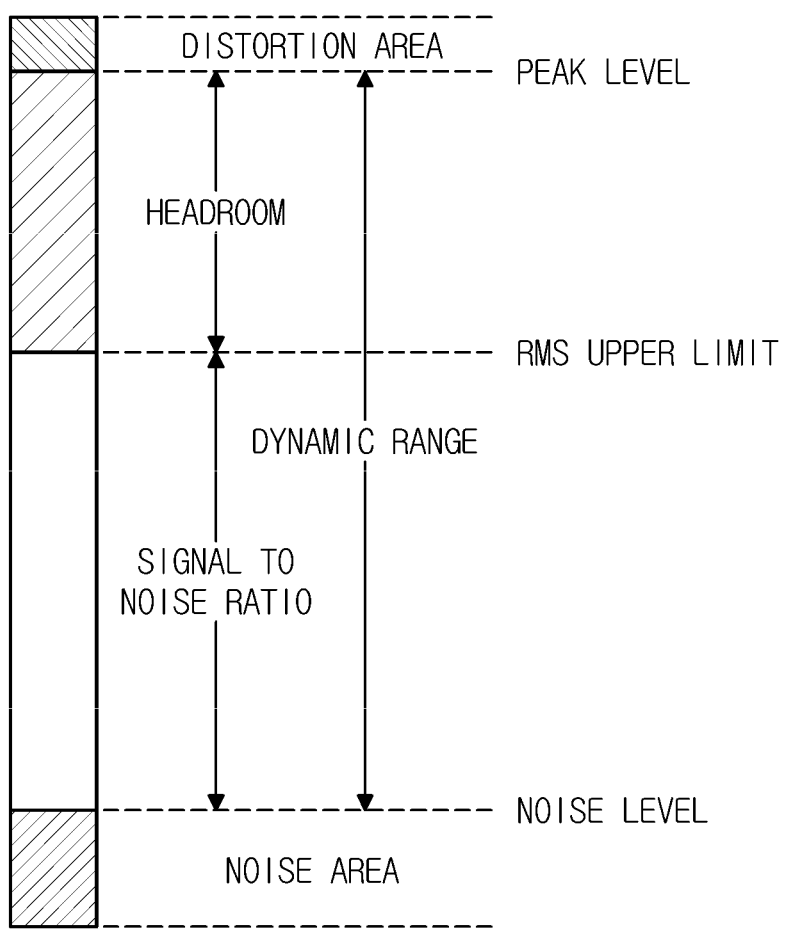
FIG. 3 is a view for describing a headroom and a dynamic range.

FIG. 3 is a view for describing a headroom and a dynamic range.

As illustrated in FIG. 3, a dynamic range is a ratio of a peak level (maximum signal level) and a noise level of the audio system 100 in decibels dB. The dynamic range may represent the range that the audio system 100 can process without distortion and noise. The audio signal below the noise level may be considered noise. The audio signal exceeding has a phenomenon in which input and output are different, that is, distortion occurs. The dynamic range may be said to be the level of the signal level that can be handled in the audio system 100, excluding the distortion and noise. Therefore, the wider the dynamic range of the audio system 100, the larger the volume of the audio signal may be output.

Signal to noise ratio may refer to an area from the noise level to an upper limit of a root mean square (RMS). The headroom 412 may refer to the area up to the RMS upper limit and the peak level. That is, the headroom 412 is the area for preventing distortion of the audio signal generated when the input audio signal exceeds the peak level by signal processing.

FIG. 4 is a view illustrating in detail a configuration of a signal processor of the audio system illustrated in FIG. 3.

In FIG. 4, the signal inputter 210 includes the headroom 412 and the signal outputter 290 includes the speaker 492 have been previously mentioned in FIG. 2.

As illustrated in FIG. 4, the signal processor 250 of the audio system 100 may include some or all of a pre-signal processor 452, a pre-scale processor 454, and a main-signal processor 456, a master volume controller 458, a post-signal processor 460.

Before describing the signal processor 250, look-up tables 472, 474, and 476 provided in the storage 270 will be described. The storage 270 may be provided with the plurality of look-up tables 472, 474, and 476. Each of the look-up tables 472, 474, and 476 may correspond to the pre-signal processor 452, the pre-scale processor 454, and the main-signal processor 456, respectively. In particular, a value of the look-up table 474 corresponding to the pre-scale processor 454 may be also provided to the post-signal processor 460. The user setting volume may be input to the three look-up tables 474, 474, and 476 and the master volume controller 458.

Each of the look-up tables 472, 474, and 476 may store various parameters used in signal processing of the pre-signal processor 452, the pre-scale processor 454, and the main-signal processor 456. The parameters stored in the look-up tables 472, 474, and 476 have values based on the user volume setting and hardware characteristics of the audio system 100. When processing the audio signal, each of the pre-signal processor 452, the pre-scale processor 454, and the main-signal processor 456 may take appropriate parameters from the look-up tables 472, 474, and 476 based on the user volume setting and the hardware characteristics of the audio system 100.

In the signal processor 250, the pre-signal processor 452 may apply the dynamic range for each area divided based on the level of the input audio signal through the dynamic range remapping, so that the volume is varied for each area of the input audio signal. That is, the pre-signal processor 452 may analyze the dynamic range of the input audio signal in consideration of variable output dynamic range conditions due to limitations due to the hardware characteristics of the audio system 100, may generate an optimal dynamic range remapping curve corresponding to each volume level of the user setting volume, and may apply the generated range is applied to rearrange the dynamic range of the input audio signal.

The pre-scale processor 454 may calculate a boosting gain determined by the user setting volume, and may apply the scaling of a size corresponding to an inverse number of the boosting gain for the input audio signal. That is, the pre-scale processor 454 may apply an optimal scaling that varies according to the user setting volume. The application of the scaling of the pre-scale processor 454 is to prevent problems such as the overflow or the clipping even when the audio signal is boosted in the main-signal processor 456 located in a next stage of the pre-scale processor 454. The pre-scaling in the pre-scale processor 454 may maintain a resolution of the input audio signal as close to an original sound as possible before the signal processing in the main-signal processor 456.

The main-signal processor 456 may apply tone mapping of the input audio signal by applying the boosting gain determined by the user setting volume. That is, the main-signal processor 456 may reflect human hearing characteristics according to the user setting volume and the hardware characteristics of the audio system 100, and may perform the tone mapping according to steps of the user setting volume. That is, the main-signal processor 456 may receive the audio signals that pass undergone dynamic range remapping and pre-scaling in the previous step, may reflect the human hearing characteristics according to the user setting volume and the hardware characteristics of the audio system 100 (for example, physical characteristics of speaker), and may perform the tone mapping according to the steps of the user setting volume. For the tone mapping, the tone mapping of different curves may be applied to each volume step for the entire volume section. Alternatively, the entire volume section may be divided into a plurality of unit volume sections, and the tone mapping of different curves may be applied to each unit section. In addition, the tone mapping of a single curve may be applied to the entire volume section. Also, the entire volume section may be divided into a low volume section and a high volume section, and the tone mapping of different curves may be applied to each volume section.

The master volume controller 458 may apply a master volume according to the user setting volume for the audio signal completed up to tone mapping. In the case of an audio mixer or the audio system having multiple level controls, the overall sound, such as volume and balance set for each channel or each amplification step, may be aggregated in the master volume to adjust the volume.

The post-signal processor 460 may perform a signal compensation for the input audio signal by the inverse number of the scaling value applied by the pre-scale processor 454. That is, the post-signal processor 460 may compensate for the signal to which the user setting volume is applied in consideration of the degree of attenuation generated during the signal processing of the pre-scale processor 454, output conditions (such as speaker specifications) and the user setting volume of the audio system 100. The signal compensation by the post-signal processor 460 may be compensated by the inverse number of pre-scaling values applied in the pre-scale processor 454. For example, if the pre-scaling is applied by −3 dB, the post-signal processor 460 may compensate by +3 dB. Since the compensation method compensates by applying a gain value corresponding to the pre-scaling value, there is an advantage of maintaining a linearity of the volume. The audio signal output from the post-signal processor 460 may be transmitted to the speaker 492.

Figure 5:
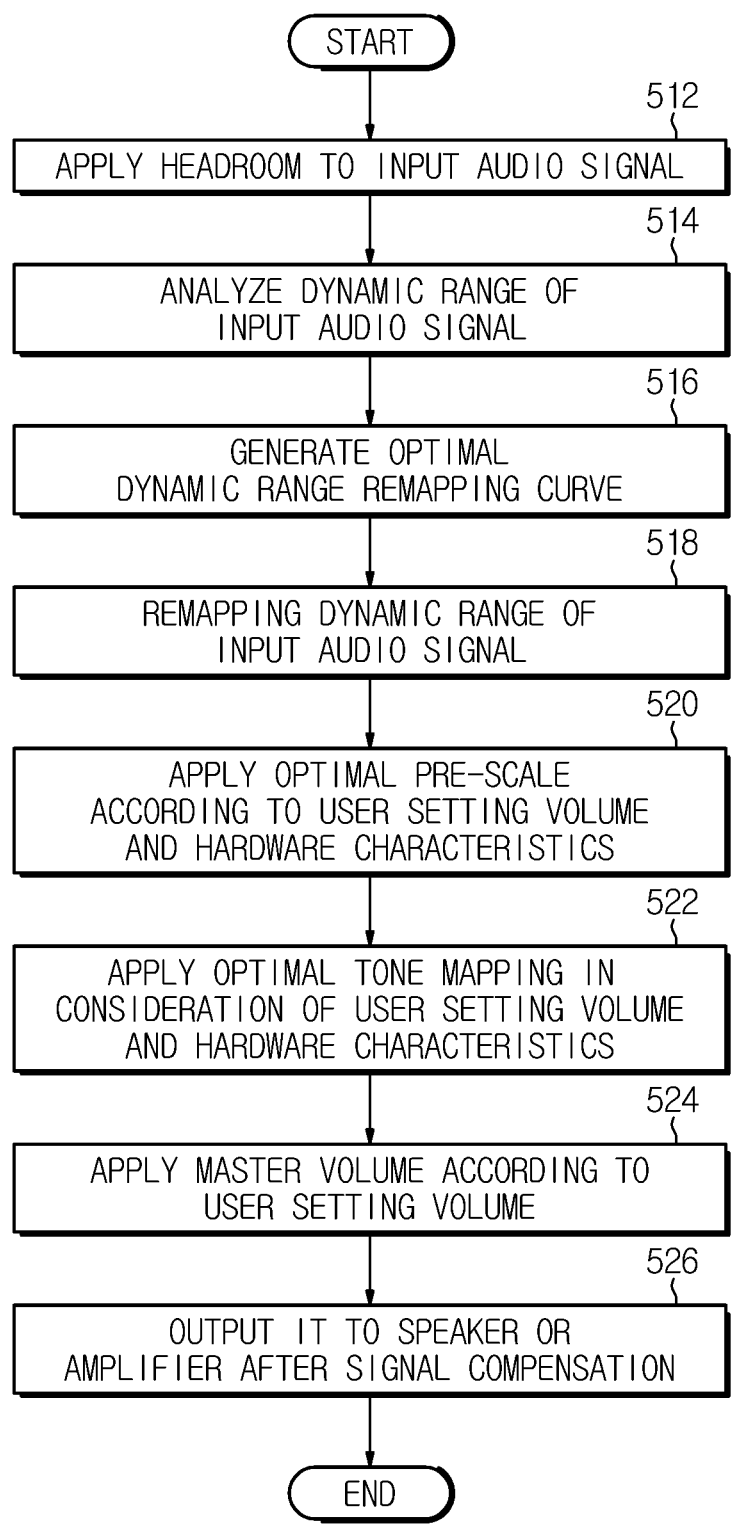
FIG. 5 is a view illustrating a method of controlling an audio system according to an embodiment.

FIG. 5 is a view illustrating a method of controlling an audio system according to an embodiment.

When the audio signal is input, before performing pre-processing, the headroom is applied to the input audio signal in consideration of the scaling or the gain applied to the signal processing (512).

First, the pre-signal processor 452 may analyze the dynamic range of the input audio signal in consideration of variable output dynamic range conditions due to limitations due to the hardware characteristics of the audio system 100 (514).

When analysis of the dynamic range of the input audio signal is completed, the optimal dynamic range remapping curve corresponding to each volume step of the user setting volume may be generated (516).

When the optimal dynamic range remapping curve is generated, the dynamic range remapping curve may be applied to remapping the dynamic range of the input audio signal (518). The remapping of the dynamic range of the audio system 100 according to the embodiment may refer to that the dynamic range is variably applied according to the change in the level of the input audio signal.

The remapping of the dynamic range will be described in more detail with reference to FIGS. 6 to 9.

FIG. 6 is a view illustrating a change in an input audio signal by dynamic range remapping according to an embodiment. FIG. 6I is then input audio signal before remapping the dynamic range, and FIG. 6II is the input audio signal after remapping the dynamic range.

The input audio signal illustrated in FIG. 6I may be divided into an A area, a B area, and a C area. The audio signal in the A area is a sufficiently high input level so that even if the user setting volume is low, the sound may be transmitted to the user (listener). The audio signal in the B area is virtually inaudible to the user unless the input level is too low and the user setting volume is extremely raised. The audio signal in the C area is inaudible to the user at a relatively low user setting volume, but has the input level that can be transmitted to the user relatively well if the user setting volume is increased appropriately. The remapping of the dynamic range is inaudible to the user at the relatively low user setting volume, such as an audio signal in the C area, but if the user setting volume is increased properly, it can be transmitted to the user relatively well. This is to increase the gain by remapping the dynamic range so that the input level of the corresponding area (C area) increases. Through the remapping of the dynamic range, the user setting volume is maintained at a current setting value (i.e., without additional manipulation of the user setting volume by the user), while maintaining good sound transmission power in the A area while maintaining C area by improving the sound transmission power of the area, sounds in both the A and C areas may be heard well.

When comparing FIG. 6I and FIG. 6II, the remapping result of the dynamic range may be seen well. As illustrated in FIG. 6II, since only the gain for the audio signal in the B area increases due to the remapping of the dynamic range and the gain of the audio signal in the A area is maintained as an original value, even if the gain of the audio signal in the B area is increased, a situation in which the volume of the A area is excessively increased does not occur (deviation reduction by area). As a result, the dynamic range remapping of the input audio signal maintains a state of the input audio signal so that it can be heard well as it is already well heard (A area). The dynamic range remapping of the input audio signal is difficult to hear in the current user setting volume, but a part that needs to be heard better by improving a sound transmission power can be heard through the remapping of the dynamic range (C area).

Figure 7:
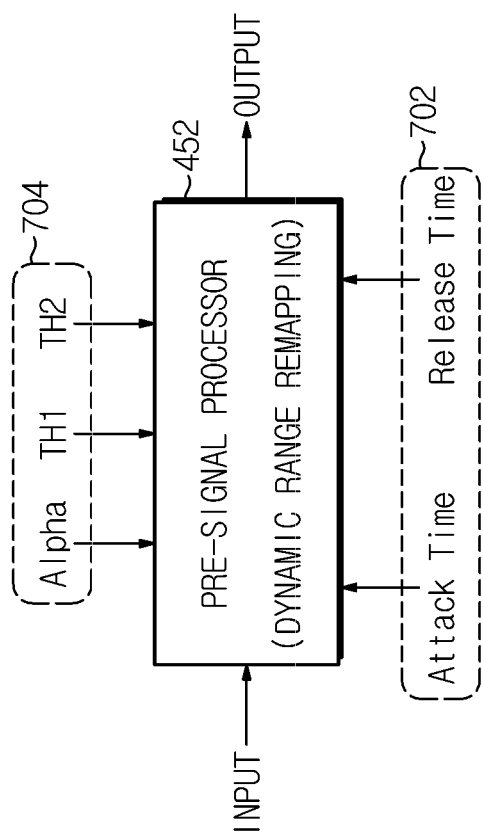
FIG. 7 is a view illustrating parameter setting for dynamic range remapping of a pre-signal processor according to an embodiment.

FIG. 7 is a view illustrating parameter setting for dynamic range remapping of a pre-signal processor according to an embodiment.

In FIG. 7, reference numeral 702 may indicate 'Attack Time' and 'Release Time', which are one of parameter groups set in the pre-signal processor 452. The dynamic range remapping may be performed based on a dynamic range compression. The 'Attack Time' may refer to a time required for the audio signal exceeding a threshold to be compressed to a preset level. The 'Release Time' may refer to a time required to restore the audio signal compressed below the threshold to its original size. When the 'Attack Time' and the 'Release Time' are set, compression and restoration of a signal of a predetermined size may be performed for the set time. For example, when the 'Attack Time' is set to 1 ms, the signal size may be reduced (compressed) by 10 dB for 1 ms.

In FIG. 7, reference numeral 704 may denote another parameter group 'Alpha', 'TH1', and 'TH2' set in the pre-signal processor 452. The parameters 'Alpha', 'TH1', and 'TH2' may be specifying a specific section in a dynamic range compression curve and setting the gain of the designated section. The meaning of the parameters 'Alpha', 'TH1', and 'TH2' will be described in detail with reference to FIG. 8.

Figure 8:
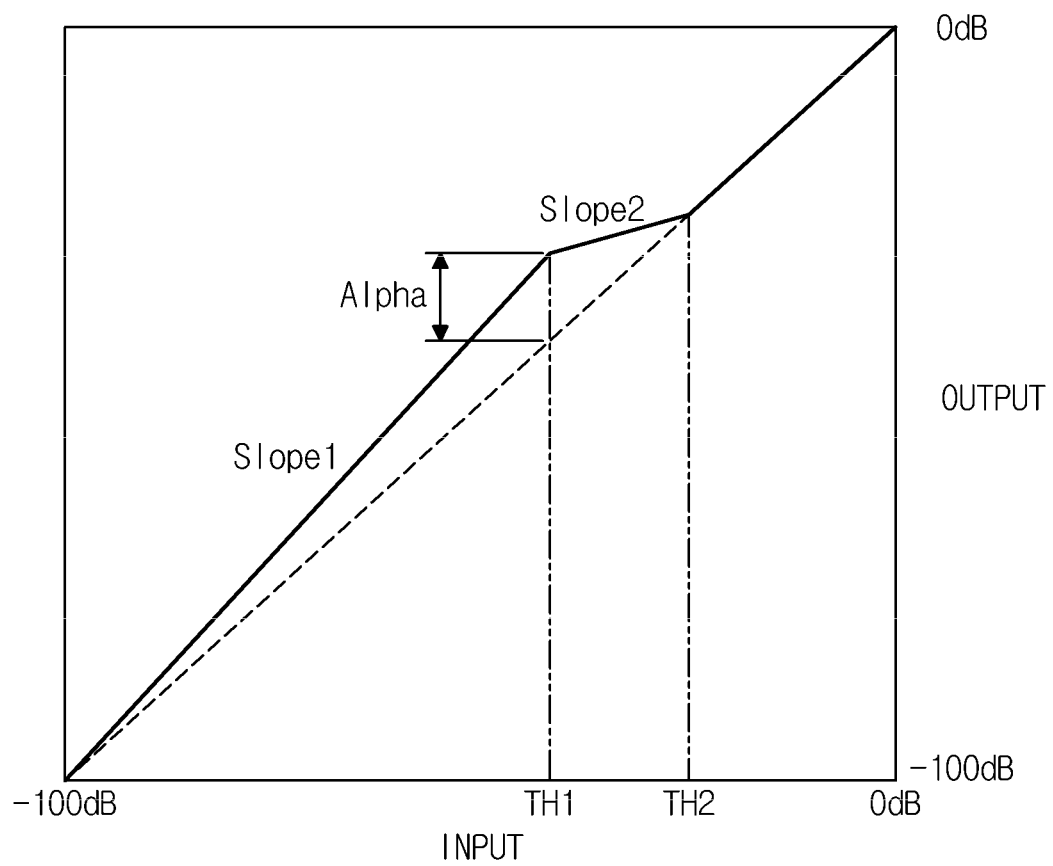
FIG. 8 is a view illustrating an example of a dynamic range compression curve for dynamic range remapping according to an embodiment.

FIG. 8 is a view illustrating an example of a dynamic range compression curve for dynamic range remapping according to an embodiment.

As illustrated in FIG. 8, the curve indicated by a dotted line is a case where the gain of the input audio signal and the output audio signal are the same. When the gain is changed in the specific section, a desired section may be set through the parameters 'TH1' and 'TH2', and the gain may be changed as much as 'Alpha' at the 'TH1' point through the parameter 'Alpha' for the gain change. In FIG. 8, the gain may increase from the −100 dB point to the 'TH1' point by 'Alpha', and may return to an original gain from the 'TH1' point to the 'TH2' point.

A design of the dynamic range compression curve may be variously adjusted and designed through the setting of the parameter groups 702 and 704 illustrated in FIG. 7 in consideration of the user setting volume and hardware characteristics. That is, for the dynamic range remapping, the parameters 'Alpha', 'TH1' and 'TH2' may be set to increase the gain in the specific section of the input audio signal to a desired size. Through the dynamic range remapping, the gain (level) of the C area of FIG. 6 described above may be selectively increased.

Figure 9:
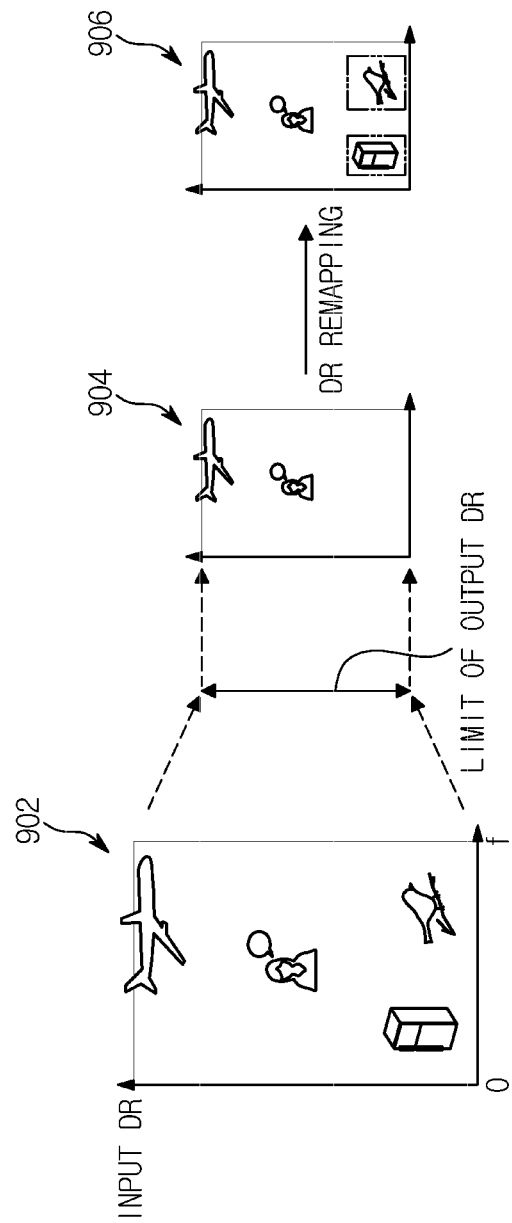
FIG. 9 is a view illustrating a concept of dynamic range remapping according to an embodiment.

FIG. 9 is a view illustrating a concept of dynamic range remapping according to an embodiment.

In FIG. 9, reference numeral 902 may indicate the audio signal to which an input dynamic range is applied. That is, the input dynamic range is wide enough to be able to express a loudness of an aircraft engine, as well as a normal size of human conversations, birds, and small sound such as a refrigerator noise.

However, if the output dynamic range is narrower than the input dynamic range due to the user setting volume and hardware characteristics (e.g., speaker output limitations), as indicated by reference numeral 904, the sound of an aircraft and human conversation is expressed, but small sounds such as new sounds and the refrigerator noise are not expressed due to the limitations of the output dynamic range.

By increasing the gain of the output audio signal through the dynamic range remapping, a clearer and louder sound may be output. Particularly, when the volume should be sufficiently understandable by the listener, such as the human conversation sound, the gain of the human conversation sound is selectively increased so that it can be heard better. To this end, the dynamic range remapping may be utilized.

So far, the dynamic range remapping performed in the pre-signal processor 452 of the audio system 100 has been described. The following describes the pre-scaling performed in the pre-scale processor 454 after the dynamic range remapping of the pre-signal processor 452.

Returning to FIG. 5 again, in a state in which the dynamic range remapping of the pre-signal processor 452 is completed, the pre-scale processor 454 may apply the optimal pre-scale reflecting the user setting volume and the hardware characteristics to the audio signal (520).

The audio signal may be boosted (amplified) when the signal processing such as the tone mapping is performed in the main-signal processor 456 located in the next step of the pre-scale processor 454. The boosting the audio signal may cause problems such as the overflow or the clipping. Therefore, in order to the overflow or clipping problems even when the audio signal is boosted in the main-signal processor 456, the optimal scaling variable according to the user setting volume may be applied in the pre-scale processor 454 located at the front end of the main-signal processor 456.

However, if a pre-scale value applied to the audio signal in the pre-scale processor 454 is fixed, a resolution of the audio signal may be lowered due to unnecessary scale application. In addition, discontinuity may occur in the output audio signal by changing the user setting volume. That is, the change in the user setting volume is not naturally reflected in the output audio signal, but a phenomenon that seems to be cut off due to scale application may occur. In order to prevent the resolution problem and the discontinuity problem, it is necessary to variably apply the pre-scale value according to the user setting volume and the output dynamic range limitation.

The optimal scaling value applied by the pre-scale processor 454 may be obtained by the following method. In the audio system 100, the gain value for boosting the main-signal processor 456 may be determined according to the user setting volume. That is, the gain value for boosting the main-signal processor 456 may be variable according to the user setting volume. Therefore, the gain value for boosting the main-signal processor 456 may be known in advance from the user setting volume. When the inverse number of the gain value for boosting the main-signal processor 456 is applied as the pre-scaling value of the pre-scale processor 454, in addition to problems such as the overflow or the clipping that may occur when processing the signal of the main-signal processor 456, it is possible to prevent the volume reduction and data loss and maintain a high resolution of the audio signal.

Figure 10:
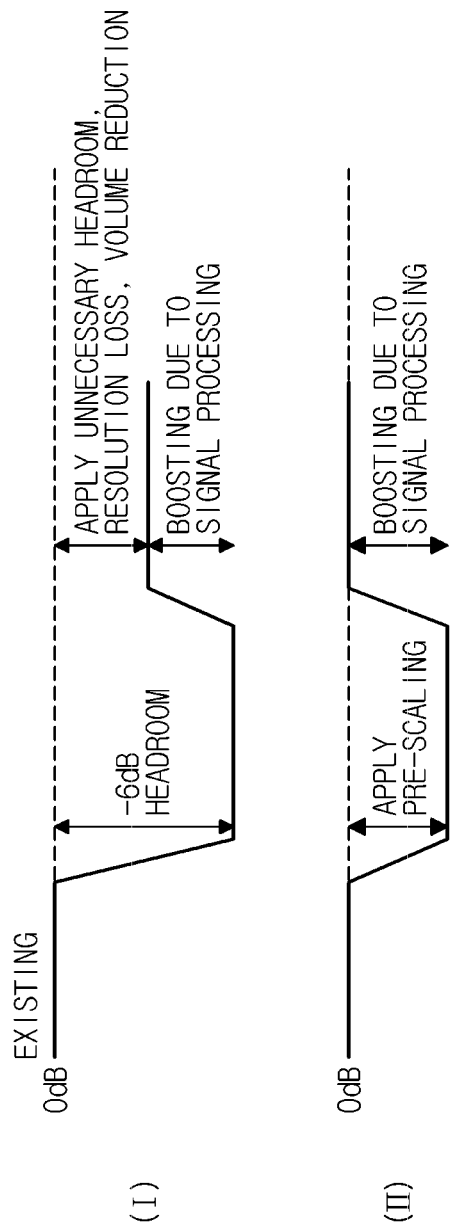
FIG. 10 is a view illustrating a change in a dynamic range of an input audio signal according to a pre-scale application of an audio system according to an embodiment.

FIG. 10 is a view illustrating a change in a dynamic range of an input audio signal according to a pre-scale application of an audio system according to an embodiment. FIG. 10I is a case where the existing fixed headroom is applied. When the headroom is fixed as described above, unnecessary headroom may be applied, resulting in a loss of resolution of the audio signal or a decrease in the volume. On the other hand, in the case of the audio system 100 illustrated in FIG. 10II, unnecessary headroom may be excluded by applying the variable and optimized pre-scale gain, and the problem of the resolution loss or volume reduction may be solved.

The pre-scaling may be applied at any stage of the audio signal processing. However, it is preferable to apply the pre-scaling between pre-signal processing (i.e., dynamic range remapping) and main-signal processing to maintain the resolution of the original sound as much as possible before the signal processing is performed. To this end, the pre-scale processor 454 may be disposed between the pre-signal processor 452 and the main-signal processor 456.

Back to FIG. 5, in the state in which the pre-scale processor 454 has been scaled, the main-signal processor 456 may perform the tone mapping to provide an optimal quality sound in a limited output dynamic range condition (522).

The main-signal processor 456 may receive the audio signals that have undergone the dynamic range remapping and the pre-scaling in a previous step, reflect the human hearing characteristics according to the user setting volume and the hardware characteristics of the audio system 100 (for example, physical characteristics of the speaker), and may perform the tone mapping according to the steps of the user setting volume. For the tone mapping, the tone mapping of different curves may be applied to each volume for each volume step. Alternatively, the entire volume section may be divided into the plurality of unit volume sections, and the tone mapping of different curves may be applied to each unit section. In addition, the tone mapping of a single curve may be applied to the entire volume section. Also, the entire volume section may be divided into the low volume section and the high volume section, and the tone mapping of different curves may be applied to each volume section.

Figure 11:
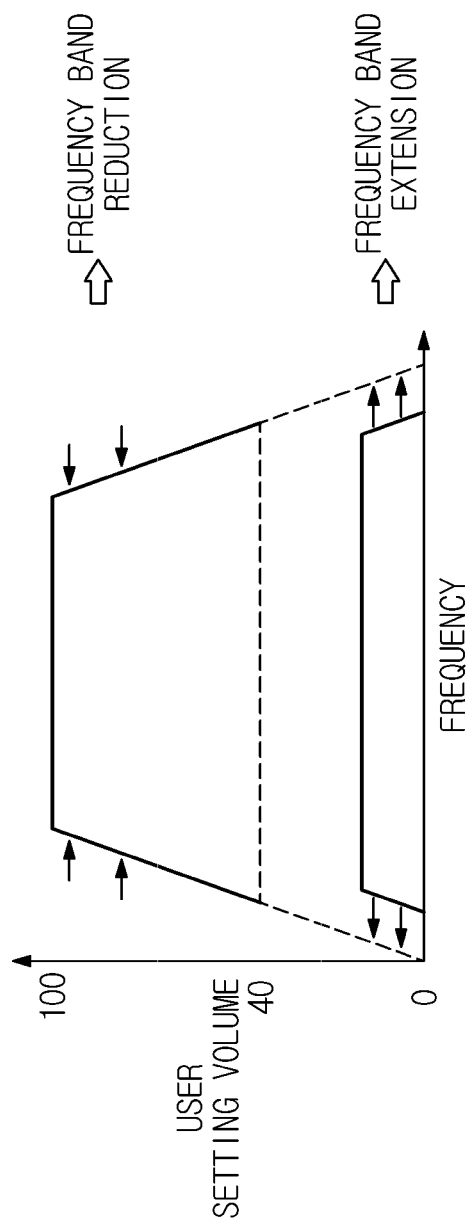
FIG. 11 is a view illustrating output characteristics of a speaker according to a user setting volume.

FIG. 11 is a view illustrating output characteristics of a speaker according to a user setting volume. As illustrated in FIG. 11, frequency output characteristics of the speaker may be variable according to the volume step. That is, when the volume of the television is set low, a low range may be more emphasized compared to the volume of a middle or higher. However, in reality, the output signal of the television's speaker may be attenuated due to the low volume setting, so that the low range may not be sufficiently expressed. When the volume of the television is set high, a strong audio signal may be output. However, the frequency characteristic that the speaker of the television can express may be reduced, and the distortion may occur in the output audio signal. That is, a frequency band of the speaker at a high volume setting may decrease (narrow). When an original input signal is biased to either the low or high pitch, the output audio signal may be distorted due to narrow frequency characteristics of the speaker. Therefore, in order to faithfully express an original feeling of the original audio signal by minimizing the influence due to the user setting volume and the hardware characteristics of the audio system 100, it is desirable to optimize the low and high frequencies in consideration of the user setting volume and the hardware characteristics. In the case of FIG. 11, the optimization of the low and high frequencies may include expanding the frequency band at the low volume so that a richer low tone can be output, or reducing the frequency band at the high volume to minimize the distortion. To this end, the low and high frequencies may be optimized by adjusting the low and high frequencies using a shelving filter in a time domain. Alternatively, the low and high frequencies may be easily optimized by appropriately adjusting signals in a frequency domain.

Figure 12:
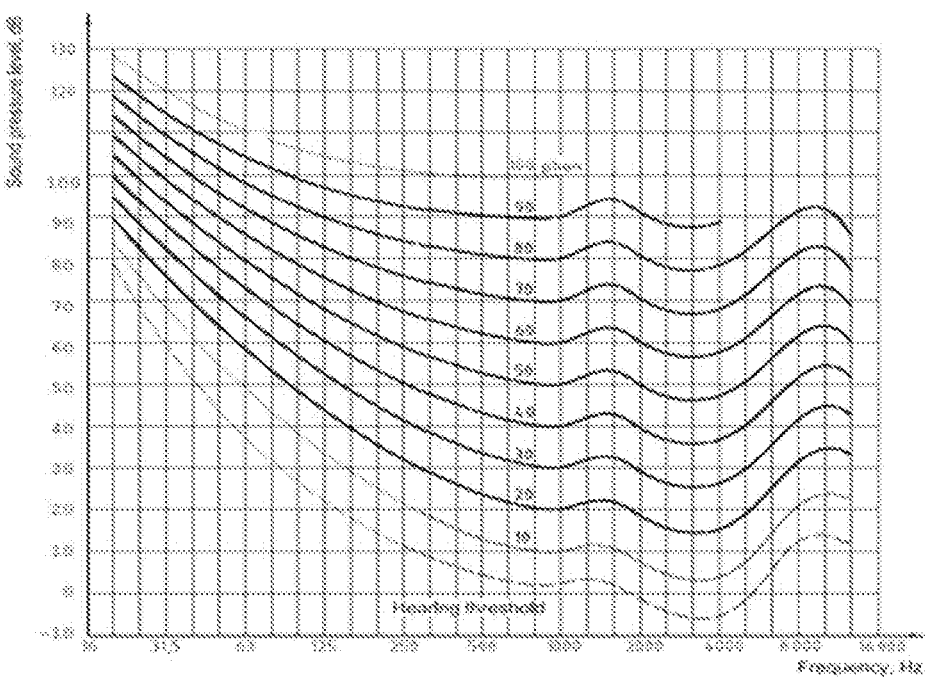
FIG. 12 is a view illustrating an equal loudness curve.

FIG. 12 is a view illustrating an equal loudness curve. The equal loudness curve may be a curve that connects points that the listener feels at the same sound intensity when listening to sounds generated by pure sine waves of different frequencies. The human's ear feels differently depending on the frequency even though it is physically the same size. For example, to feel the loudness of a 60-phon sound, 60 dB SPL is required for a 1 kHz sine wave, and 78 dB SPL is required for a 100 Hz sine wave. In consideration of this, the equal loudness curve (Equal-Loudness Contour) may be an experimentally investigated and displayed sound pressure level for each frequency heard in the same loudness.

Looking at the equal loudness curve illustrated in FIG. 12, a person feels the volume differently for each frequency depending on the volume. The person may not be able to hear the low end signal that could be heard at the high user setting volume because the output volume is low at the low user setting volume.

When performing the tone mapping in the main-signal processor 456 of the audio system 100, appropriate tone mapping is applied in consideration of human hearing characteristics and hardware characteristics of the audio system 100 according to the user setting volume so that the characteristics of the original audio signal can be maintained at both the low user setting volume and the high user setting volume. With this proper tone mapping, the original audio signal's specificity may be maintained at any user setting volume.

FIG. 13 is a view illustrating an example of a tone mapping curve generated by a main-signal processor of an audio system according to an embodiment. As illustrated in FIG. 13, a basic tone mapping curve generated for each volume step may be applied in consideration of the human hearing characteristics and various system characteristics according to the user setting volume. The tone mapping curve as illustrated in FIG. 13 may be designed in various forms according to the person's hearing characteristics and characteristics of the audio system 100.

FIG. 14 is a view illustrating a signal in which dynamic range remapping and tone mapping are performed in an audio system according to an embodiment. In FIG. 14, FIG. 14I may be the input audio signal, FIG. 14II may be the signal to which the dynamic range remapping is applied, and FIG. 14III may be the signal to which the dynamic range remapping and the tone mapping are applied. Looking at a portion indicated by an ellipse in FIG. 14, it may be seen that the input audio signal of FIG. 14I increased in FIG. 14II through the dynamic range remapping. In addition, in FIG. 14III, it may be seen that the audio signal is optimized by appropriate tone mapping considering the human hearing characteristics and the hardware characteristics of the audio system 100 according to the user setting volume.

Figure 15:
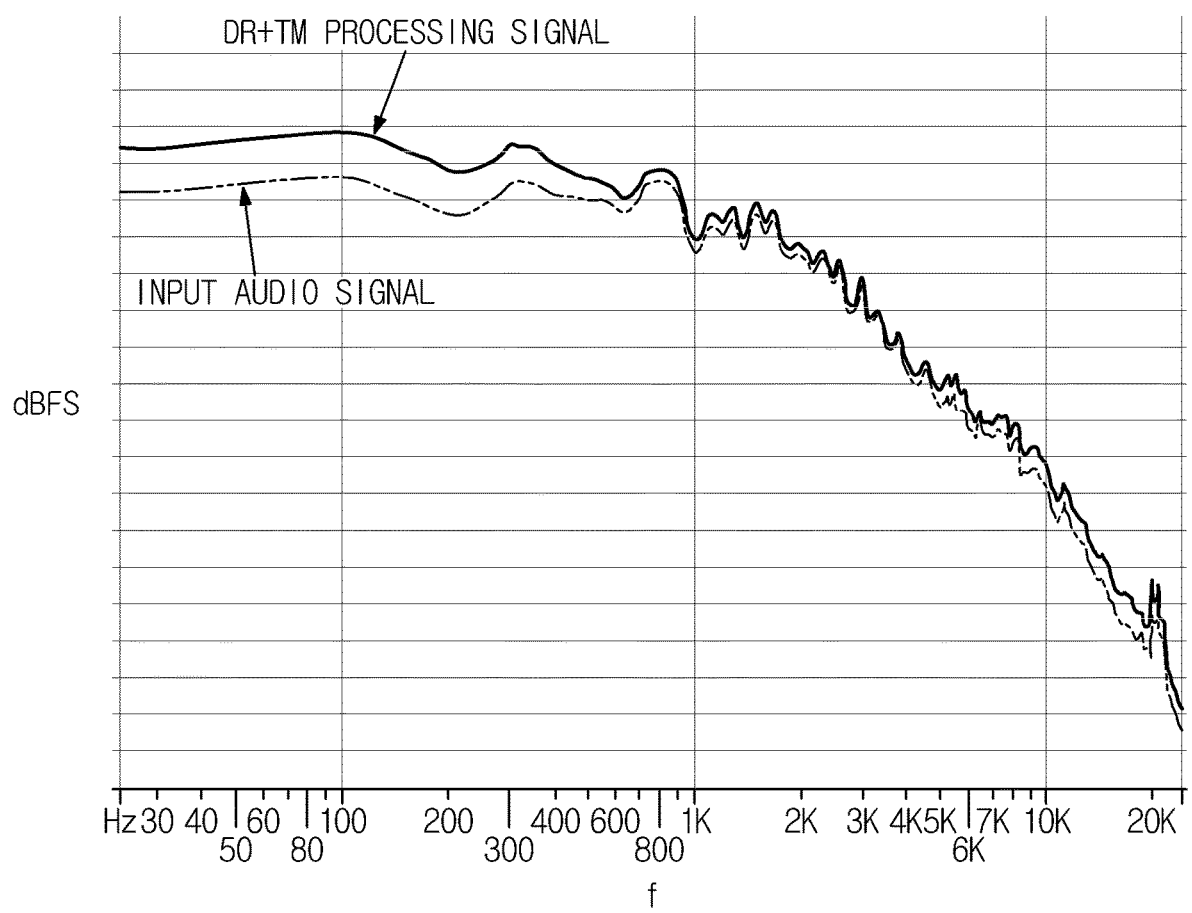
FIG. 15 is a characteristic graph for each frequency of FIG. 14I to FIG. 14III.

FIG. 15 is a characteristic graph for each frequency of FIG. 14I to FIG. 14III described above. As can be seen in FIG. 15, the audio signal may be optimized for each frequency according to user setting volume and the hardware characteristics through the dynamic range remapping and the tone mapping according to the embodiment.

Back to FIG. 5, the master volume controller 458 may apply the master volume according to the user setting volume for the audio signal completed up to tone mapping (524). In the case of the audio mixer or the audio system 100 having multiple level controls, the overall sound, such as volume and balance set for each channel or each amplification step, may be aggregated in the master volume to adjust the volume.

Subsequently, the post-signal processor 460 may finally perform the signal compensation on the audio signal to which the master volume is applied, and may output it to the speaker 492 (or amplifier) (526).

The signal compensation by the post-signal processor 460 may be compensated by the inverse number of pre-scaling values applied in the pre-scale processor 454. For example, if the pre-scaling is applied by −3 dB, the post-signal processor 460 may compensate by +3 dB. Since the compensation method compensates by applying the gain value corresponding to the pre-scaling value, there is the advantage of maintaining the linearity of the volume.

Another signal compensation by the post-signal processor 460 may be to determine a compensation value in consideration of the hardware characteristics of the audio system 100. In the method of compensating for the inverse number of the pre-scaling value described above, the volume may be increased, but depending on the characteristics of the audio system 100, it may be unreasonably compensated or have little effect of compensation. Therefore, when calculating the compensation value, it is possible to secure the high volume through the compensation by sufficiently reflecting the characteristics of the audio system 100 that may vary according to the user setting volume.

A reason for performing a post-signal processing after the master volume is applied to the audio signal may be because it has a high degree of freedom in adjusting the volume of the output audio signal and may provide the highest volume allowed by the audio system 100 under the same user volume setting condition. Since the post-signal processing is to compensate the audio signal after applying the master volume, it is important to appropriately reduce or increase the volume in accordance with the step value of the user setting volume when compensating the audio signal in the previously signal processing. For example, when the user attempts to decrease or increase the volume, the volume of the output audio signal is naturally lowered or increased linearly in accordance with the change of the user setting volume to apply the appropriate compensation value to maintain a linear feeling in movement between the volume steps. In addition, it is necessary to apply the signal compensation value so that a volume inversion phenomenon caused by the signal compensation does not occur. The volume inversion phenomenon is when an actual volume is lowered despite the high user setting volume.

Figure 16:
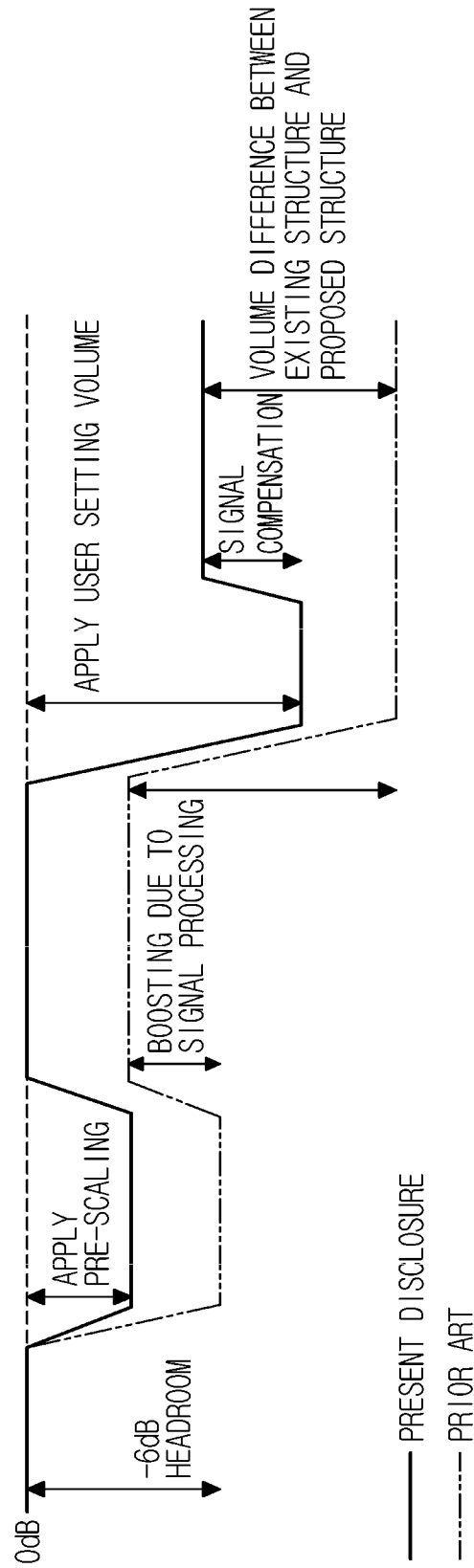
FIG. 16 is a view comparing a change in a dynamic range of an audio system according to an embodiment with a conventional case.

FIG. 16 is a view comparing a change in a dynamic range of an audio system according to an embodiment with a conventional case. In FIG. 16, a solid line may indicate the change in the dynamic range according to the embodiment, and the dotted line may indicate the change in a conventional dynamic range. As can be seen in FIG. 16, in the audio system 100 according to the embodiment, an application of unnecessary headroom may be excluded by applying a variable and optimized pre-scale gain, and by increasing the volume of the output audio signal through the signal compensation after applying the user setting volume, it is possible to provide a relatively larger volume than the conventional case under the same user setting volume condition.

Figure 17:
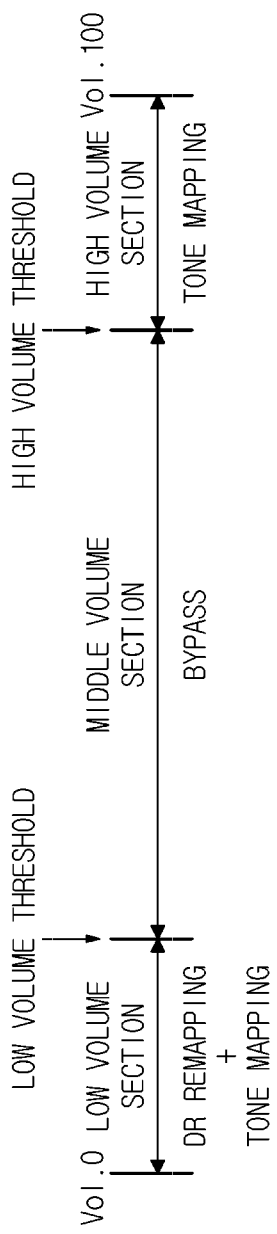
FIG. 17 is a view illustrating a partition of a volume section for differentiated signal processing for each volume section of an audio system according to an embodiment.

FIG. 17 is a view illustrating a partition of a volume section for differentiated signal processing for each volume section of an audio system according to an embodiment The audio system 100 may divide the entire volume section into the plurality of sections and perform various different combinations of signal processing for each section. As illustrated in FIG. 17, the entire volume section may be divided into a 'low volume section', a 'middle volume section', and a 'high volume section'. That is, a low volume threshold and a high volume threshold may be set. Below the low volume threshold may be classified as the 'low volume section', above the high volume threshold may be classified as the 'high volume section', and the section higher than the low volume threshold and lower than the high volume threshold may be classified as the 'middle volume section'. The low volume threshold and the high volume threshold may be determined according to the hardware characteristics of the audio system 100. In addition, the volume threshold may be further set and classified into more volume sections.

In the 'low volume section', the small sound may not be heard well, and due to the hardware characteristics, a bass may not be expressed well. Therefore, when the user setting volume belongs to the 'low volume section', the signal processing involving the dynamic range remapping and the tone mapping may be performed.

In the 'middle volume section', the output signal is of an appropriate size, and relatively good sound is output due to relatively little influence of the hardware characteristics. Therefore, when the user setting volume belongs to the 'middle volume section', it does not perform the signal processing such as separate dynamic range remapping or pre-scaling, and reproduces the original sound as it is or close to the original sound (bypass). Of course, the dynamic range remapping or the tone mapping may also be performed in the 'middle volume section' depending on the hardware characteristics.

In the 'high volume section', the frequency characteristic of the speaker 492 is narrowed, and the output signal may be distorted. Therefore, when the user setting volume belongs to the 'high volume section', it is desirable to prevent the distortion of the output signal as much as possible through the signal processing accompanied by an appropriate level of tone mapping. Also, in the 'high volume section', the dynamic range remapping may be omitted because the output signal is large, so even a small sound can be heard relatively well. In addition, the pre-scaling may be omitted in the 'high volume section' because the audio signal is generally attenuated. However, the dynamic range remapping and the pre-scaling may also be performed according to the input audio signals and the hardware characteristics in the 'high volume section'.

Figure 18:
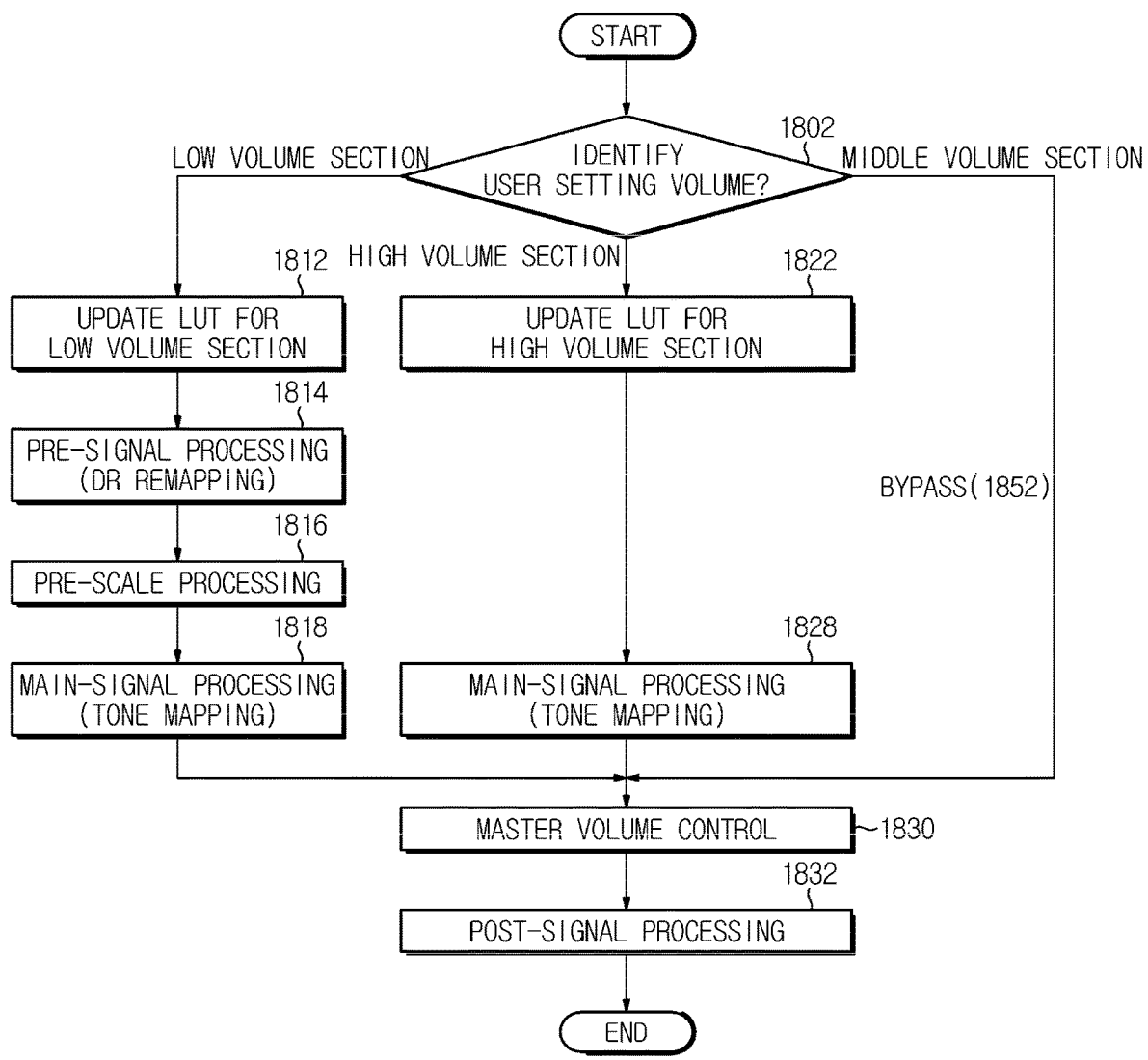
FIG. 18 is a view illustrating a differentiated signal processing method for each volume section of an audio system according to an embodiment.

FIG. 18 is a view illustrating a differentiated signal processing method for each volume section of an audio system according to an embodiment. A signal processing method of FIG. 18 may be based on the partitioning of the volume section for differentiated signal processing illustrated in FIG. 17 above.

First, the current user setting volume of the audio system 100 may be identified (1802). When the user setting volume is identified, identify whether the current user setting volume belongs to the 'low volume section', the 'high volume section', or the 'middle volume section'. In the audio system 100 according to the embodiment, the entire volume section may be divided into the plurality of sections such as the 'low volume section', the 'high volume section', and the 'middle volume section' to perform the signal processing in various combinations for each section.

<Low Volume Section>

When the current user setting volume belongs to the 'low volume section', the lookup table 472, 474, and 476 may be updated for the low volume section (1812). That is, when the user setting volume belongs to the 'low volume section', the parameters for appropriate signal processing may be fetched from the look-up tables 472, 474, and 476 so that signal processing can be performed.

When the user setting volume belongs to the 'low volume section', the small sound may be difficult to hear, and the bass may not be expressed well due to the hardware characteristics. Therefore, in the 'low volume section', the remapping of the dynamic range through the pre-signal processing of the pre-signal processor 452 (1814), the pre-scaling of the pre-scale processor 454 (1816), and the tone mapping (1818) through the main-signal processing of the main-signal processor 456 may be performed. This series of signal processing performed when the user setting volume belongs to the 'low volume section' may provide improved sound quality and good volume even under low user volume conditions.

When the tone mapping by the main-signal processor 456 is completed, the master volume application by the master volume controller 458 and the post-signal processing (signal compensation) (1832) by the post-signal processor 460 may be performed. The audio signal after the post-signal processing is completed may be output to the speaker 492 (or amplifier).

<High Volume Section>

When the current user setting volume belongs to the 'high volume section', the lookup tables 472, 474, and 476 may be updated for the high volume section (1822). That is, when the user setting volume belongs to the 'high volume section', the parameters for appropriate signal processing may be fetched from the look-up tables 472, 474, and 476 so that signal processing can be performed.

When the user setting volume belongs to the 'high volume section', since the frequency characteristic of the speaker 492 is narrowed and the output signal may be distorted, the signal processing involving the tone mapping through the main-signal processor 456 may be performed to prevent the signal distortion (1828). In the 'high volume section', the dynamic range remapping may be omitted because the output signal is large and the small sound can be heard relatively well. In addition, the pre-scaling may also be omitted because the audio signal is generally attenuated in the 'high volume section'.

When the tone mapping by the main-signal processor 456 is completed, the master volume application by the master volume controller 458 and the post-signal processing (signal compensation) (1832) by the post-signal processor 460 may be performed. The audio signal after the post-signal processing is completed may be output to the speaker 492 (or amplifier).

<Middle Volume Section>

When the user setting volume belongs to the 'middle volume section', the output signal is of a suitable size and relatively good influence may be output due to relatively little influence of the hardware characteristics. Therefore, when the user setting volume belongs to the 'middle volume section', by performing only the master volume control (1830) and the post-signal processing (1832) without performing the signal processing such as separate dynamic range remapping or pre-scaling, the original sound may be reproduced as it is or close to the original sound (bypass) (1852).

Figure 19:
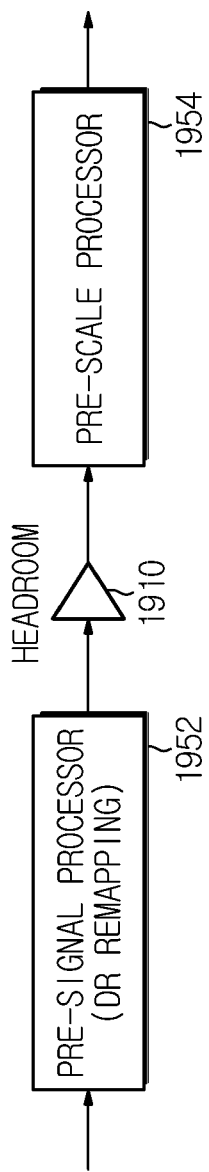
FIG. 19 is a view illustrating a modified embodiment of a position in which dynamic range remapping is performed in signal processing of an audio system according to an embodiment.

FIG. 19 is a view illustrating a modified embodiment of a position in which dynamic range remapping is performed in signal processing of an audio system according to an embodiment.

In the embodiment of FIG. 4 described above, a series of signal processing may be performed as the audio signal to which the headroom is applied passed through the pre-signal processor 452 and the pre-scale processor 454 in turn. That is, in the embodiment of FIG. 4, the signal processing may be performed in the order of the headroom application—the dynamic range remapping—the scaling application.

Alternatively, in another embodiment illustrated in FIG. 19, the dynamic range remapping through the pre-signal processing is first performed before the headroom is applied, followed by the headroom application and the pre-scaling. In particular, as illustrated in FIG. 19, when the pre-signal processing step is arranged before applying the headroom, the headroom application and the pre-scaling process may be integrated into one process.

In the case of FIG. 19, the dynamic range remapping through the pre-signal processing may be performed before the pre-scaling. Thus, the resolution loss of the input audio signal may be minimized by performing the dynamic range remapping before the pre-scaling.

The disclosed embodiments are merely illustrative, and those skilled in the art will appreciate that various modifications, changes, and substitutions may be made without departing from the essential characteristics thereof. Therefore, the exemplary embodiments disclosed above and the accompanying drawings are not intended to limit the technical idea, but to describe the technical spirit, and the scope of the technical idea is not limited by the embodiments and the accompanying drawings. The scope of protection shall be interpreted by the following claims, and all technical ideas within the scope of equivalents shall be interpreted as being included in the scope of rights.

The invention claimed is:

1. An audio system comprising:
a signal inputter configured to receive an input audio signal;
a signal processor configured to
variably apply a dynamic range remapping curve for each area of the input audio signal, the input signal being divided into areas based on a level of the input audio signal,
apply a scaling of a size corresponding to an inverse number of a boosting gain determined by a user setting volume for the input audio signal,
perform a tone mapping of the input audio signal by applying the boosting gain,
perform signal compensation for the input audio signal by the inverse number of the scaling, and
apply a master volume according to the user setting volume;
a storage configured to store parameters used in signal processing of the signal processor; and
a signal outputter configured to output the audio signal processed by the signal processor.

2. The audio system according to claim 1, wherein the signal processor comprises:
a pre-signal processor configured to variably apply the dynamic range remapping curve for each area of the input audio signal;
a pre-scale processor configured to apply the scaling of the size corresponding to the inverse number of the boosting gain determined by the user setting volume for the input audio signal;
a main-signal processor configured to perform the tone mapping of the input audio signal by applying the boosting gain; and
a post-signal processor configured to perform the signal compensation for the input audio signal by the inverse number of the scaling.

3. The audio system according to claim 2, wherein the main-signal processor is configured to perform the tone mapping by reflecting human hearing characteristics and output characteristics of the audio system according to the user setting volume.

4. The audio system according to claim 2, wherein the main-signal processor is configured to apply the tone mapping of different curves for each volume step of an entire volume section.

5. The audio system according to claim 2, wherein the main-signal processor is configured to divide an entire volume section into a plurality of unit volume sections, and to apply the tone mapping of different curves to each of the plurality of unit sections.

6. The audio system according to claim 2, wherein the main-signal processor is configured to divide an entire volume section into a low volume section and a high volume section, and to apply the tone mapping of different curves to each of the low volume section and the high volume section.

7. The audio system according to claim 2, further comprising:
a master volume controller configured to apply the master volume according to the user setting volume.

8. The audio system according to claim 2, further comprising:
a headroom is applied to the input audio signal prior to the signal processing of the pre-signal processor.

9. The audio system according to claim 2, further comprising:
a headroom is applied to the input audio signal after the signal processing of the pre-signal processor.

10. A method of controlling an audio system comprising:
a pre-signal processing step of variably applying a dynamic range remapping curve for each area of an input audio signal;
a pre-scale processing step of applying a scaling of a size corresponding to an inverse number of a boosting gain determined by a user setting volume for the input audio signal;
a main-signal processing step of performing a tone mapping of the input audio signal by applying the boosting gain; and
a post-signal processing step of performing signal compensation on the input audio signal by the inverse number of the scaling.

11. The method according to claim 10, wherein the main-signal processing step is configured to perform the tone mapping by reflecting human hearing characteristics and output characteristics of the audio system according to the user setting volume.

12. The method according to claim 10, wherein the main-signal processing step is configured to apply the tone mapping of different curves for each volume step of an entire volume section.

13. The method according to claim 10, wherein the main-signal processing step is configured to divide an entire volume section into a plurality of unit volume sections, and to apply the tone mapping of different curves to each of the plurality of unit sections.

14. The method according to claim 10, wherein the main-signal processing step is configured to divide an entire volume section into a low volume section and a high volume section, and to apply the tone mapping of different curves to each of the low volume section and the high volume section.

15. The method according to claim 10, further comprising:
a master volume control step of applying a master volume according to the user setting volume.

16. The method according to claim 10, further comprising:
applying a headroom to the input audio signal prior to signal processing in the pre-signal processing step.

17. The method according to claim 10, further comprising:
applying a headroom to the input audio signal after signal processing in the pre-signal processing step.

18. A method of controlling an audio system comprising:
a pre-signal processing step of variably applying a dynamic range remapping curve for each area of an input audio signal;
a pre-scale processing step of applying a scaling of a size corresponding to an inverse number of a boosting gain determined by a user setting volume for the input audio signal;
a main-signal processing step of performing a tone mapping of the input audio signal by applying the boosting gain;
a master volume control step of applying a master volume according to the user setting volume; and
a post-signal processing step of performing signal compensation on the input audio signal by the inverse number of the scaling.

19. The method according to claim 18, further comprising:
dividing an entire volume section into a low volume section, a high volume section, and a middle volume section;
when the user setting volume belongs to the low volume section, performing the pre-signal processing step, the pre-scale processing step, the main-signal processing step, the master volume control step, and the post-signal processing step;
when the user setting volume belongs to the high volume section, performing only the main-signal processing step, the master volume control step, and the post-signal processing step; and
when the user setting volume belongs to the middle volume section, performing only the master volume control step and the post-signal processing step.

20. An audio system comprising:
a pre-signal processor configured to vary a volume of each area of an input audio signal by variably applying a dynamic range remapping curve for each area divided based on an input audio signal level;
a pre-scale processor configured to calculate a boosting gain determined by a user setting volume and to apply a scaling of a size corresponding to an inverse number of the boosting gain to the input audio signal;
a main-signal processor configured to perform a tone mapping of the input audio signal by applying the boosting gain determined by the user setting volume; and
a post-signal processor configured to perform signal compensation for the input audio signal by the inverse number of the scaling applied by the pre-scale processor.

* * * * *